(12) United States Patent
Watanabe et al.

(10) Patent No.: US 7,376,536 B2
(45) Date of Patent: May 20, 2008

(54) METHOD FOR INVESTIGATING CAUSE OF DECREASE IN FREQUENCY OF ABNORMALITY DETECTIONS, METHOD FOR IMPROVING FREQUENCY OF ABNORMALITY DETECTIONS AND ELECTRONIC CONTROL APPARATUS

(75) Inventors: Masatoshi Watanabe, Hyogo (JP);
Shigeru Matsumoto, Hyogo (JP);
Koichi Ohgaki, Hyogo (JP);
Kazumasa Iwakawa, Hyogo (JP)

(73) Assignee: Fujitsu Ten Limited, Hyogo (JP)

( * ) Notice: Subject to any disclaimer, the term of this patent is extended or adjusted under 35 U.S.C. 154(b) by 78 days.

(21) Appl. No.: 11/391,302

(22) Filed: Mar. 29, 2006

(65) Prior Publication Data

US 2006/0241831 A1   Oct. 26, 2006

(30) Foreign Application Priority Data

Mar. 31, 2005 (JP) ............................. P2005-104179
Feb. 7, 2006 (JP) ............................. P2006-029424

(51) Int. Cl.
*G06F 11/30* (2006.01)
*G21C 17/00* (2006.01)

(52) U.S. Cl. .................................................... 702/185

(58) Field of Classification Search ................ 702/104, 702/113, 116, 127, 182–185
See application file for complete search history.

(56) References Cited

U.S. PATENT DOCUMENTS

| | | | |
|---|---|---|---|
| 6,615,152 B2 * | 9/2003 | Fujimoto et al. | 702/94 |
| 7,103,459 B2 * | 9/2006 | Suzuki | 701/29 |
| 7,275,525 B2 * | 10/2007 | Miyasako et al. | 123/568.16 |

* cited by examiner

*Primary Examiner*—Michael P. Nghiem
(74) *Attorney, Agent, or Firm*—Oliff & Berridge, PLC

(57) ABSTRACT

A method for investigating a cause of decrease in frequency of abnormality detections for a certain device mounted on a vehicle, wherein when a plurality of abnormality detection conditions are satisfied, the abnormality detection for the certain device is performed to determine if the certain device is in failure, the method includes (i) when the frequency of the abnormality detections is below a predetermined value, disabling one of the abnormality detection conditions; (ii) when the abnormality detection conditions except the disabled abnormality detection condition are satisfied, performing an abnormality detection for the certain device; (iii) repeating the step (ii) a plurality of times; and (iv) determining if the disabled abnormality detection condition at that time is the cause of the decrease in the frequency of the abnormality detections, based on frequency of the abnormality detections in the step (iii).

26 Claims, 11 Drawing Sheets

FIG. 6

```
if (A and B) /*hierarchic layer 1*/
    {
        if (C and D) /*hierarchic layer 2*/
            {
                if (E and F) /*hierarchic layer 3*/
                    {
                        abnormality detection processing;
                    }
            }
    }
else another processing;
```

FIG. 8

```
if (A and B) /*hierarchic layer 1*/
    {
        monitor flag 1 = ON;          ←801
        if (C and D) /*hierarchic layer 2*/
            {
                monitor flag 2 = ON;  ←802
                if (E and F) /*hierarchic layer 3*/
                    {
                        monitor flag 3 = ON;  ←803
                        abnormality detection processing;
                    }
            }
    }
else another processing;
```

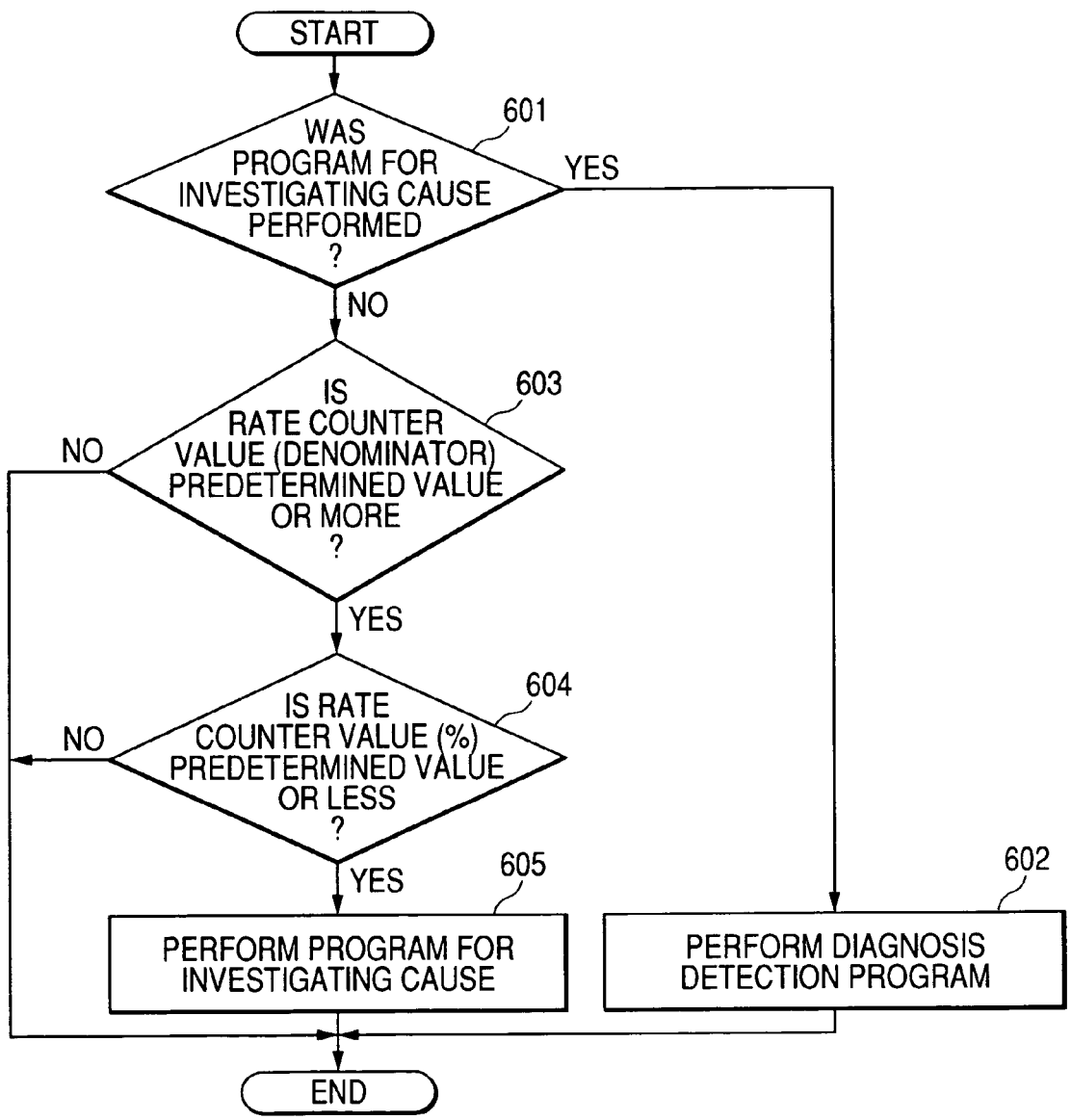

FIG. 11A

```
IF((WATER TEMPERATURE>80°C)
&(VEHICLE SPEED<30km/h)
&(SENSOR A=ON))
```

DURING DIAGNOSIS DETECTION

FIG. 11B

```
IF((WATER TEMPERATURE>MIN VALUE)
&(VEHICLE SPEED<30km/h)
&(SENSOR A=ON))
```

DURING CAUSE INVESTIGATION

FIG. 11C

```
IF((WATER TEMPERATURE>80°C)
&(VEHICLE SPEED<MAX VALUE)
&(SENSOR A=ON))
```

DURING CAUSE INVESTIGATION

FIG. 11D

```
IF((WATER TEMPERATURE>80°C)
&(VEHICLE SPEED<30km/h)
&((SENSOR A=ON)
  OR(SENSOR A=OFF)))
```

DURING CAUSE INVESTIGATION

FIG. 12A

```
IF(((WATER TEMPERATURE>80°C)
  OR(FLAG1=ON))
&((VEHICLE SPEED<30km/h)
  OR(FLAG1=ON)))
                  *VALUE OF FLAG 1 IS OFF
```

DURING DIAGNOSIS DETECTION

FIG. 12B

```
IF(((WATER TEMPERATURE>80°C)
  OR(FLAG1=OFF))
&((VEHICLE SPEED<30km/h)
  OR(FLAG1=ON)))
                  *VALUE OF FLAG 1 IS OFF
```

DURING CAUSE INVESTIGATION

FIG. 12C

```
IF(((WATER TEMPERATURE>80°C)
  OR(FLAG1=ON))
&((VEHICLE SPEED<30km/h)
  OR(FLAG1=OFF)))
                  *VALUE OF FLAG 1 IS OFF
```

DURING CAUSE INVESTIGATION

METHOD FOR INVESTIGATING CAUSE OF DECREASE IN FREQUENCY OF ABNORMALITY DETECTIONS, METHOD FOR IMPROVING FREQUENCY OF ABNORMALITY DETECTIONS AND ELECTRONIC CONTROL APPARATUS

CROSS-REFERENCE TO RELATED APPLICATIONS

This application is based upon and claims the benefit of priorities from Japanese Patent Application No. 2005-104179 filed on Mar. 31, 2005 and Japanese Patent Application No. 2006-29424 filed on Feb. 7, 2006, the entire contents of which are incorporated herein by reference.

FIELD OF THE INVENTION

The invention relates to a method for investigating cause of decrease in frequency of abnormality detections when the frequency of the abnormality detections decreases, a method for improving the frequency of the abnormality detections and an electronic control apparatus.

DESCRIPTION OF THE RELATED ART

If an abnormality detection for each portion of an electronic control unit (ECU) for controlling a vehicle is not performed, trouble in vehicle's running may occur. In some cases, such a trouble makes the vehicle be not able to move. Therefore, reliability is increased by providing each ECU with a self-diagnosis function. That is, each ECU performs a diagnosis processing including: automatically checking operating states of a CPU and sensors of the vehicle at appropriate intervals; lighting an abnormality lamp when a malfunction occurs; and storing an abnormality code (diagnosis trouble code; DTC) of the malfunction so that a repair shop can recognize contents of the malfunction.

Operations of each ECU in the case where each ECU performs diagnosis processing for a sensor will be described with reference to a flowchart shown in FIG. 14.

When the diagnosis processing for the sensor is performed, each ECU periodically performs a sensor abnormality diagnosis program shown in the flowchart of FIG. 14. When this abnormality diagnosis program is started, it is determined whether or not execution condition of the abnormality detection, that is, a diagnosis detection condition, is satisfied (Step 701).

For example, when an abnormality diagnosis for an engine knocking sensor is performed, it is determined that the execution condition of abnormality detection is satisfied when a condition that water temperature is 80° C. or higher, a condition that vehicle speed is 30 km/h or higher, a condition that normality of a water temperature sensor and the like are satisfied.

When the execution condition of the abnormality detection is satisfied, it is determined whether or not the abnormality condition is satisfied, by determining whether or not a state where an output value of, for example, the sensor is out of a predetermined range continues for a predetermined time period (Step 702). When the abnormality condition is satisfied, an abnormality code is stored in a memory (Step 703).

On the other hand, when the abnormality condition is not satisfied, it is determined whether or not a normality condition is satisfied, by determining whether or not a state where the output value of the sensor is within the predetermined range continues for a predetermined time period (Step 704). When the normality condition is satisfied, the fact that the sensor is in a normal state is stored in the memory (Step 705).

As described, each ECU performs the diagnosis processing. Generally, each vehicle is equipped with a diagnosis master ECU. In order to know frequency of the diagnosis detections for each sensor of the vehicle, the diagnosis master ECU checks the sensors of the vehicle whose frequency of the diagnosis detections is low, by calculating a ratio ((number of times execution condition is satisfied)/(time of time IG is turned on)) of number of times the execution condition is satisfied to number of driving based on number of ON/OFF of an ignition switch, that is, calculating a rate counter.

That is, although, the US laws stipulates that a value of the rate counter is a predetermined value or more, there may be a case where the rate counter does not indicate the predetermined value or high when a driving manner of a driver and/or condition settings are inadequate. For example, the execution condition of the diagnosis detection may not be satisfied when a vehicle repeatedly runs a short distance. Therefore, the sensor, whose frequency of the diagnosis detections is low, is checked.

SUMMARY OF THE INVENTION

As mentioned above, generally, the diagnosis master ECU of each vehicle checks the sensors whose frequency of the diagnosis detections are low. However, even when the diagnosis master ECU detects a sensor, whose frequency of the diagnosis detections decreases, it is difficult to determine its cause, that is, what an element of the execution condition and/or normality/abnormality condition is not satisfied. Therefore, it is impossible to improve a condition of such an element to increase the frequency of the diagnosis detections.

Under these circumstances, the invention has been made, and provides a method for automatically rewriting software of a diagnosis detection section with using a reprogramming function when frequency of diagnosis detections decreases; automatically investigating a case of the decrease in the frequency of the diagnosis detections based on "changed contents of the rewritten software" and "change in the detection frequency after rewriting"; and improving the frequency of the diagnosis detections.

According to an aspect of the invention, a method for investigating a cause of decrease in frequency of abnormality detections for a certain device mounted on a vehicle, wherein when a plurality of abnormality detection conditions are satisfied, the abnormality detection for the certain device is performed to determine if the certain device is in failure, the method includes (i) when the frequency of the abnormality detections is below a predetermined value, disabling one of the abnormality detection conditions; (ii) when the abnormality detection conditions the one of which has been disabled are satisfied, performing an abnormality detection for the certain device; (iii) repeating the step (ii) a plurality of times; and (iv) determining if the disabled abnormality detection condition at that time is the cause of the decrease in the frequency of the abnormality detections, based on frequency of the abnormality detections in the step (iii).

BRIEF DESCRIPTION OF THE DRAWINGS

FIG. 6 shows an example of a diagnosis including hierarchical conditional statements.

FIG. 8 shows an example of a reprogrammed source in which processing of setting the monitor flag to ON when each condition is satisfied is incorporated into next to each condition.

FIG. 9 is a flowchart showing procedures when a cause of the decrease in the frequency of the diagnosis detections is investigated while a vehicle is running.

FIG. 10 shows an example of a diagnosis detection condition.

FIG. 11 shows examples in which the diagnosis detection condition shown in FIG. 10 is rewritten in the diagnosis detection and in investigating the cause of the decrease in the frequency of the diagnosis detections.

FIG. 12 shows an example of a diagnosis detection condition to which an OR condition, which is usually not satisfied, is set.

DETAILED DESCRIPTION OF EMBODIMENTS OF THE INVENTION

A method for investigating a cause of decrease in frequency of abnormality detections and a method for improving the frequency of the abnormality detections according to embodiments of the invention will be described below with reference to the accompanying drawings.

Embodiment 1

Figure 1:
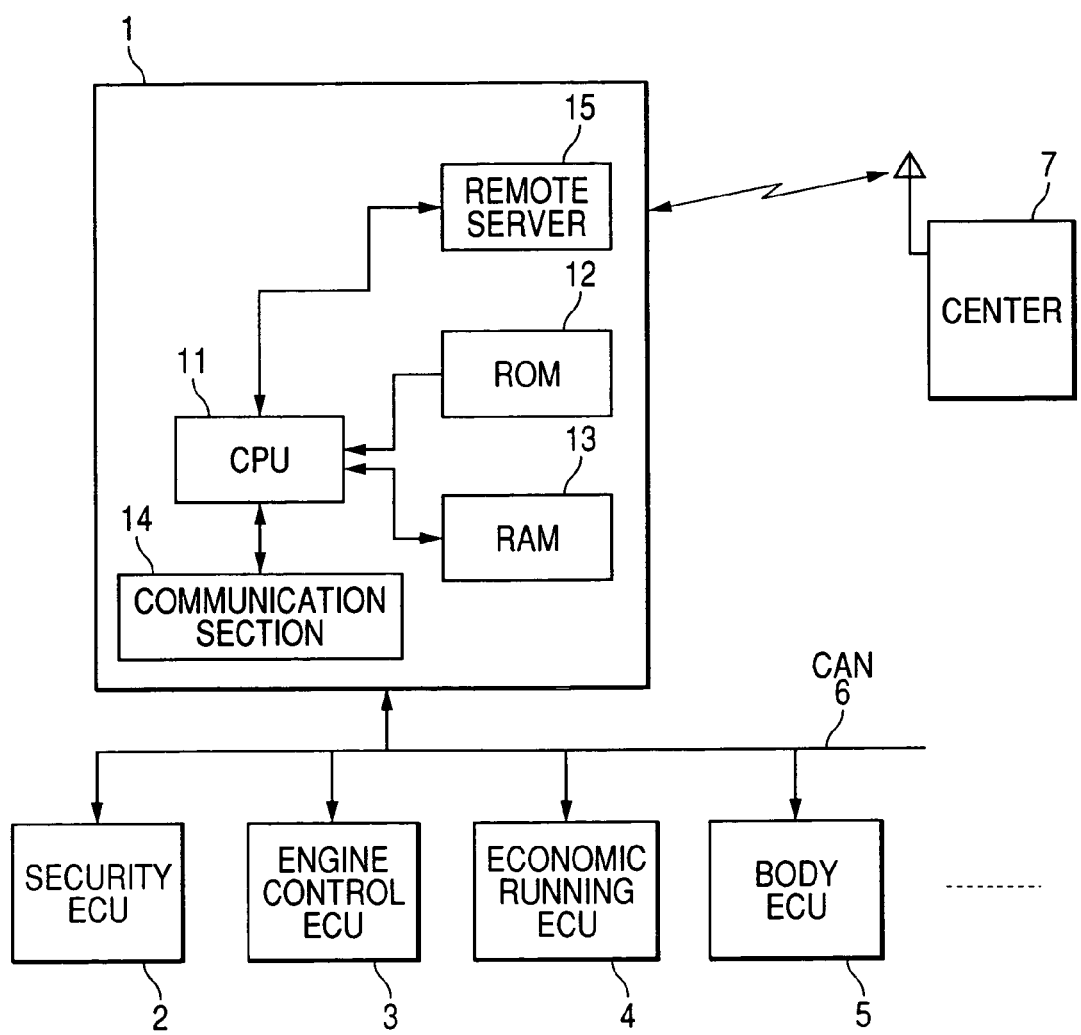
FIG. 1 is a block diagram showing a configuration of an ECU system for executing a method according to embodiments.

FIG. 1 is a block diagram showing a configuration of an ECU system that performs a method for investigating a cause of decrease in frequency of abnormality detections and a method for improving the frequency of the abnormality detections according to embodiments.

As shown in FIG. 1, in the ECU system of this embodiment, a plurality of ECUs are are connected through dedicated communication lines that is, a Control Area Network (CAN) 6 to form a network. The ECUs includes a security ECU 2 for detecting vehicle theft, an engine control ECU 3 for controlling an engine, an economical running ECU 4 for performing an automatic engine stop/restart control when a predetermined condition is satisfied and a body ECU 5 for controlling lamps and doors. A diagnosis master ECU 1 is further connected to the CAN 6.

The diagnosis master ECU 1 monitors the operations of the respective ECUs through the CAN 6 to detect an ECU, which operates abnormally. When detecting such an ECU, the diagnosis master ECU 1 initializes the ECU through the CAN 6. Also, when there is a sensor whose frequency of the diagnosis detections decreases, the diagnosis master ECU 1 investigates a cause thereof and improves the detection frequency.

As shown in FIG. 1, the diagnosis master ECU 1 includes a CPU 11, a ROM (Read Only Memory) 12, a RAM (Random Access Memory) 13, a communication section 14 and a remote server 15. The CPU 11 controls hardware portions of the diagnosis master ECU 1 and performs various programs on the basis of programs stored in the ROM 12.

The ROM 12 stores a program for investigating a cause of decrease in frequency of diagnosis, a program for improving the diagnosis frequency and diagnosis software of various sensors. The RAM 13 maybe formed of an SRAM. The RAM 13 stores temporary data such as a program for rewriting the diagnosis software of the sensors.

The communication section 14 performs data communication between other ECUs through the CAN 6. The remote server 15 transmits/receives data to/from a center 7 through electromagnetic wave, etc.

Incidentally, the center 7 is, for example, an information management center of a vehicle manufacturer or that of a car dealer shop. The center 7 uses "cause condition/cause portion of decrease in detection frequency" and "vehicle information" transmitted from the diagnosis master ECU 1 as reference data for countermeasures against the decrease in the frequency of the diagnosis detections. Also, the center 7 transmits, to the remote server 15, information used for temporarily improving the frequency of the diagnosis detections of a sensor whose frequency of the diagnosis detections has decreased by rewriting software.

In the case where it is found from information transmitted from the diagnosis master ECU 1 that the frequency of the diagnosis detections decreases or in the case where abnormality codes are not stored despite of malfunction of a sensor, a user brings a vehicle to a repair shop such as a car dealer and run the vehicle on a chassis to investigate a cause of the decrease in the frequency of the diagnosis detections for each sensor. Hereinafter, procedures of investigating a case of decrease in frequency of diagnosis detections for diagnosis, which uses conjunctively connected diagnosis detection conditions, that is, execution conditions for abnormality detection, will be described.

Figure 2:
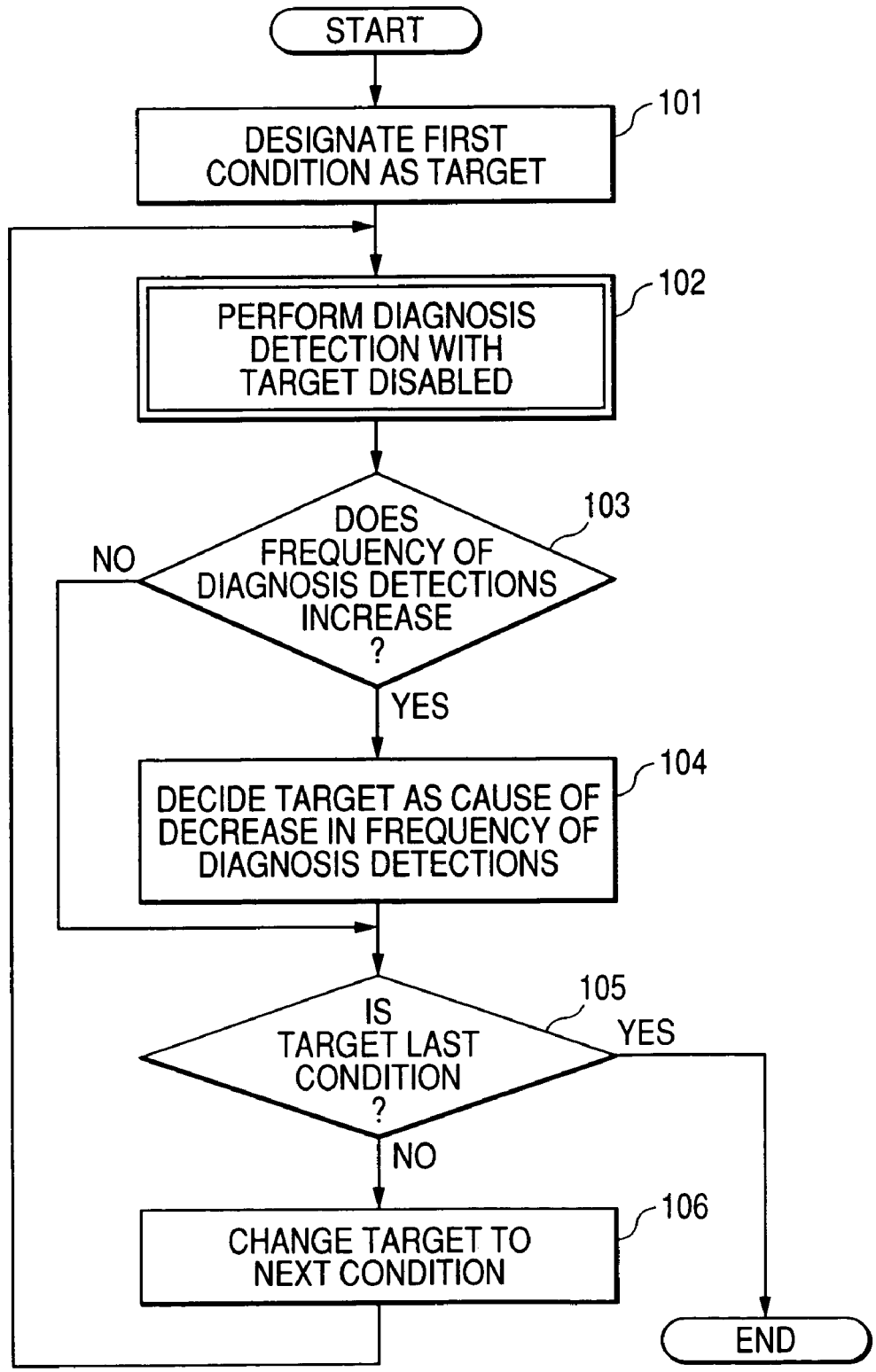
FIG. 2 is a flowchart showing procedures in a case where conjunctively connected diagnosis detection conditions are disabled one by one in order from the top.

For example, when investigating the cause of the decrease in the frequency of the diagnosis detections is instructed from a diagnosis tester connected to the CAN 6, the CPU 11 of the diagnosis master ECU 1 performs a program, shown in a flowchart of FIG. 2, for investigating the cause of the decrease in the frequency of the diagnosis detections. The CPU 11 designates a first condition of the conjunctively connected diagnosis detection conditions as a target (Step 101). Specific examples of the diagnosis detection conditions will be later with reference to FIGS. 10 to 12. Then, the CPU 11 rewrites diagnosis software for a sensor in question to disable the designated target condition, and turns on and off an ignition switch, for example, ten times or more with the rewritten software to perform diagnosis detections for the sensor in question (Step 102).

Next, the CPU 11 compares frequency of the diagnosis detections performed by the rewritten diagnosis software with the frequency of the diagnosis detections before rewriting, to determine whether or not the frequency of the diagnosis detections is increased (Step 103). When the CPU 11 determines that the frequency of the diagnosis detections is increased, the designated target condition is decided as the cause of decrease in the detection frequency (Step 104).

On the other hand, when the CPU 11 determines that the frequency of the diagnosis detections is not increased, the CPU 11 determines whether or not the designated target condition is the last condition of the conjunctively connected diagnosis detection conditions (Step 105).

When the CPU 11 determines that the designated target condition is not the last condition of the conjunctively connected diagnosis detection conditions, the CPU 11 changes the target condition to a next target condition (Step 106). Then, the CPU 11 rewrites the diagnosis software for the sensor in question and performs the diagnosis detection for the sensor in question with the rewritten diagnosis software (Step 102). Specifically, the CPU 11 rewrites the diagnosis software for the sensor in question at Step 102 so that the previous target condition is enabled and the current target condition is disabled.

When the CPU 11 determines in the Step 105 that the designated target condition is the last condition of the conjunctively connected diagnosis detection condition, the CPU 11 terminates the program. If there is another sensor whose frequency of diagnosis detections decreases, the CPU 11 tries to investigate a cause of the decrease in the frequency of the diagnosis detections for another sensor.

As described above, in the first embodiment, the diagnosis master ECU 1 disables the conjunctively connected diagnosis detection conditions are disabled one by one from the top (from the first condition to the last condition) in order by rewriting diagnosis detection software for a sensor in question, and performs the diagnosis detections for the sensor in question with the rewritten software. Thereby, it is possible to automatically investigate a cause of decrease in frequency of the diagnosis detections.

Embodiment 2

In the first embodiment, the cause of decrease in the frequency of the diagnosis detections is investigated by disabling conjunctively connected diagnosis detection conditions one by one from the top to the last. Alternatively, the cause of decrease in the frequency of the diagnosis detections may be investigated by disabling conjunctively connected diagnosis detection conditions one by one from a condition having the highest possibility of the cause in order. This case will be described with reference to a flowchart shown in FIG. 3.

It is noted that the second embodiment uses the same hardware configuration as that shown in FIG. 1, a detailed description of the hardware will be omitted. The order of the conjunctively connected conditions in the possibility of the cause of decrease in detection frequency may be stored in the ROM 12.

Figure 3:
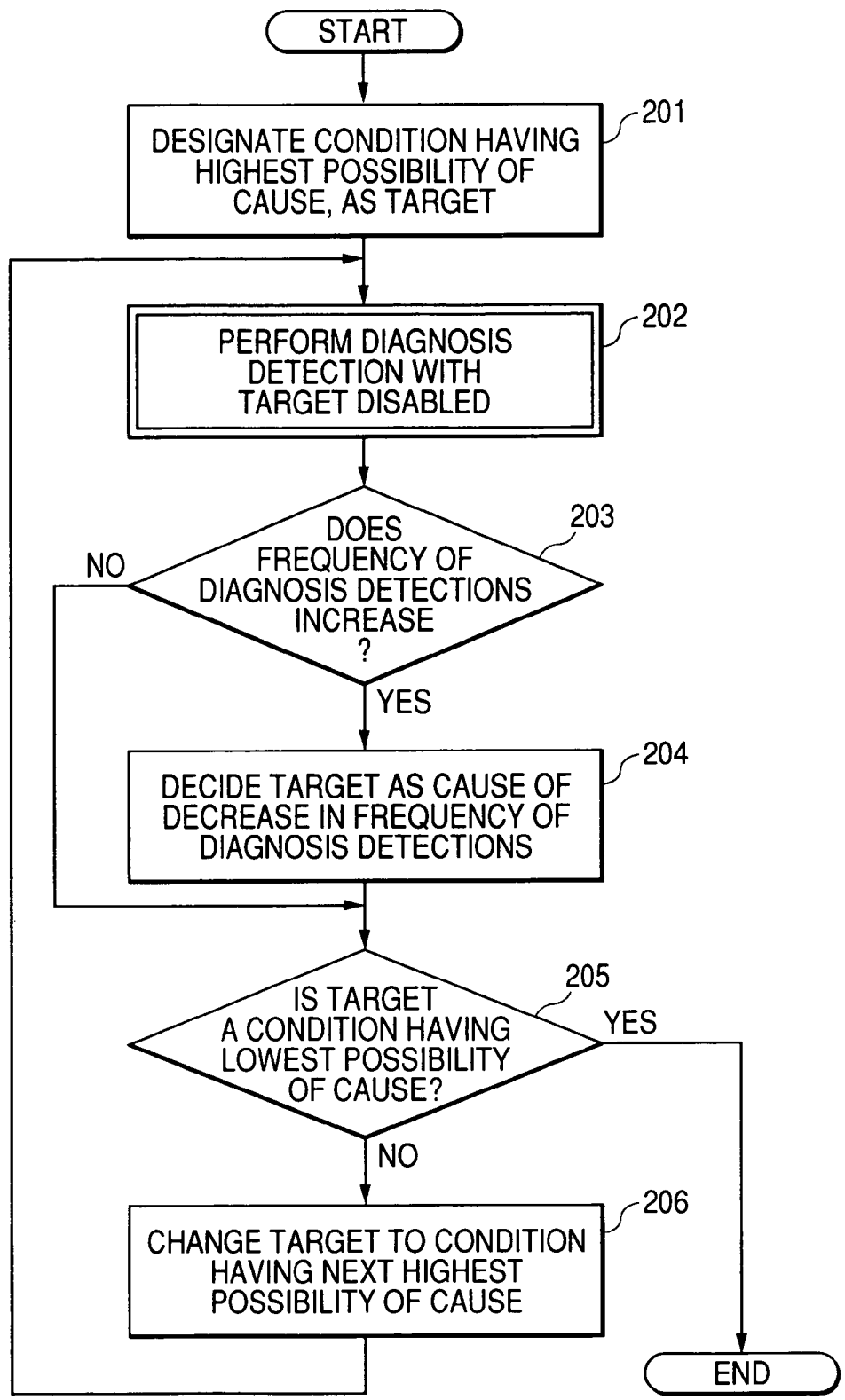
FIG. 3 is a flowchart showing procedures in a case where the conjunctively connected diagnosis detection conditions are disabled one by one in order of possibility of a cause of decrease in frequency of diagnosis detections.

When investigating a cause of the decrease in the frequency of the diagnosis detections is instructed, the CPU 11 of the diagnosis master ECU 1 performs a program, shown in a flowchart of FIG. 3, for investigating the cause of the decrease in the frequency of the diagnosis detections. At first, the CPU 11 reads a condition having the highest possibility in the cause among the conjunctively connected diagnosis detection conditions from the ROM 12, and designates the read condition as a target (Step 201). Then, the CPU 11 rewrites diagnosis software for a sensor in question to disable the designated target condition, and performs diagnosis detections for the sensor in question (Step 202).

Next, the CPU 11 determines whether or not the diagnosis detections using the rewritten diagnosis software increases the frequency of the diagnosis detections (Step 203). When the CPU 11 determines that the frequency of the diagnosis detections is increased, the designated target condition is decided as the cause of decrease in the detection frequency (Step 204).

On the other hand, when the CPU 11 determines that the frequency of the diagnosis detections is not increased at Step 203 or after the cause of the decrease is decided at Step 204, the CPU 11 determines whether or not the designated target condition is a condition having the lowest probability of the cause (Step 205). When the CPU 11 determines that the designated target condition is a condition having the lowest probability of the cause, the CPU 11 terminates the program. When the CPU 11 determines that the designated target condition is not a condition having the lowest probability of the cause, the CPU 11 changes the target condition to another condition having the next highest possibility of the cause (Step 206). Then, the CPU 11 performs the diagnosis detection for the sensor in question with rewritten software (Step 202).

Specifically, the CPU 11 changes a target condition from a currently designated target condition to another condition, which has a possibility of the cause next to that of the currently designated target condition. Then, the CPU 11 rewrites the diagnosis software for the sensor in question at Step 202 so that the previous target condition is enabled and the current target condition is disabled.

As described, in the second embodiment, the diagnosis master ECU 1 disables the conjunctively connected diagnosis detection conditions are disabled one by one from the condition having the highest possibility of the cause in order by rewriting diagnosis detection software for a sensor in question, and performs the diagnosis detections for the sensor in question with the rewritten software. Thereby, it is possible to automatically investigate a cause of decrease in frequency of the diagnosis detections.

Embodiment 3

Further, the cause of decrease in the frequency of the diagnosis detections may be investigated by designating one of conjunctively related abnormality detection conditions as a target condition and repeating "enabling only the target condition" and "disabling only the target condition." This case will be described with reference to a flowchart shown in FIG. 4.

In the third embodiment, it is assumed that the diagnosis detection is performed based on a diagnosis detection condition "if (condition X and condition Y and condition Z)". That is, the diagnosis detection condition includes the conditions X, Y and Z. Normally, when all the conditions X, Y and Z are satisfied, a diagnosis detection is performed for a sensor in question.

Figure 4:
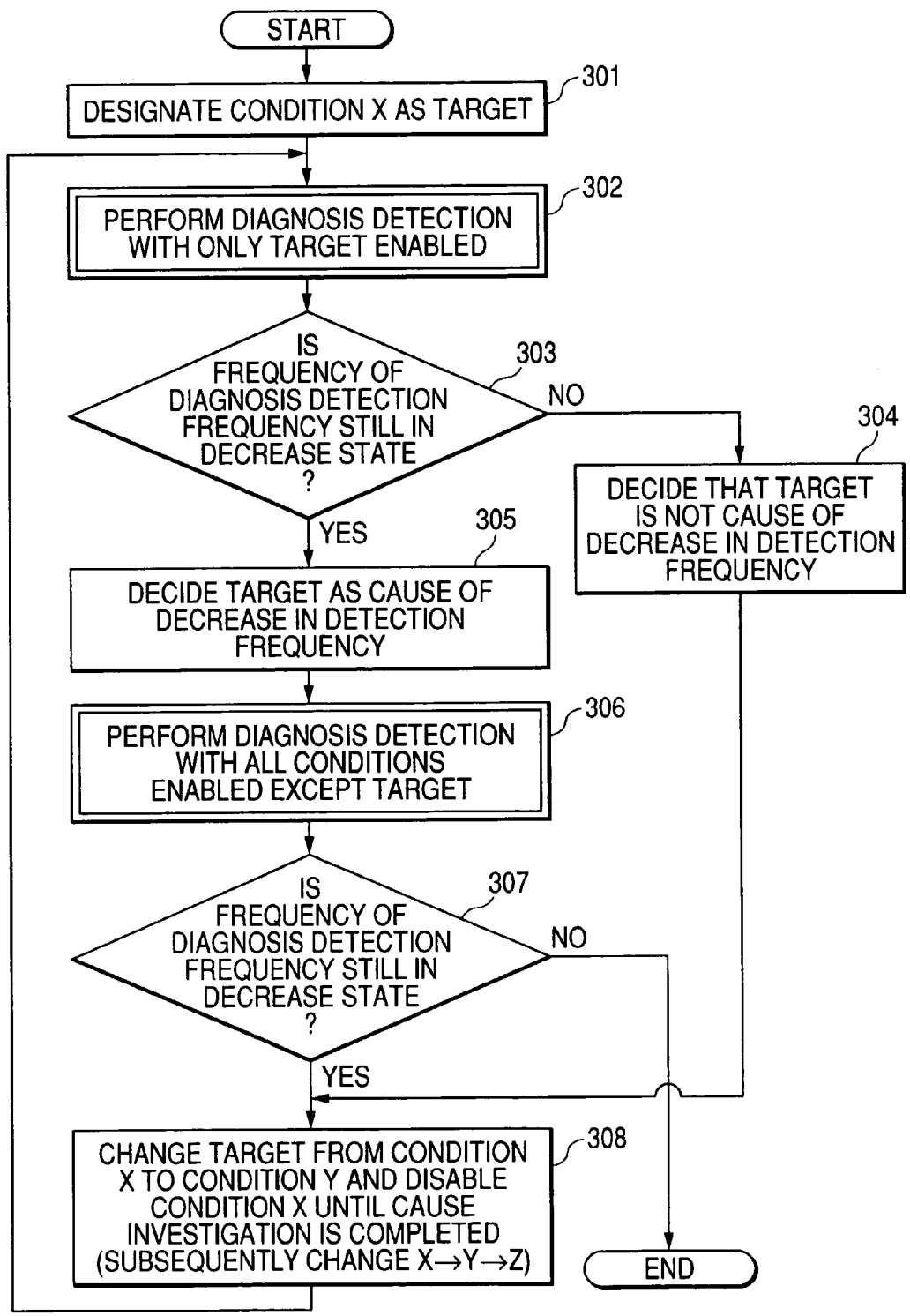
FIG. 4 is a flowchart showing procedures in a case where "enabling only a target condition" and "disabling only the target condition" are repeated.

When investigating a cause of the decrease in the frequency of the diagnosis detections is instructed, the CPU 11 of the diagnosis master ECU 1 performs a program, shown in the flowchart of FIG. 4, for investigating the cause of the decrease in the frequency of the diagnosis detections. At first, the CPU 11 designate the condition X as a target (Step 301). Then, the CPU 11 rewrites diagnosis software for a sensor in question so that only the designated target condition is enabled, and performs diagnosis detections for the sensor in question with the rewritten diagnosis software (Step 302). For example, the CPU 11 rewrites the diagnosis software for the sensor in question so that only the designated condition X is enabled and the remaining conditions Y and Z are disabled, and then performs the diagnosis detection for the sensor in question when the only enabled condition X is satisfied.

Next, the CPU 11 determines whether or not the diagnosis detections using the rewritten diagnosis software still keeps the frequency of the diagnosis detections in the decrease state (Step 303). When the CPU 11 determines that the frequency of the diagnosis detections increases, it is decided that the designated target condition is not the cause of the decrease in the frequency of the diagnosis detections (Step 304). On the other hand, when it is decided in Step 303 that the diagnosis detection frequency is kept in the decrease states, the CPU 11 decides that the designated target condition is the cause of the decrease in the frequency of the diagnosis detections (Step 305).

Next, the CPU 11 rewrites the diagnosis software for the sensor in question so that all the conditions are enabled except the designated target condition, and performs the diagnosis detections for the sensor in question with the rewritten software (Step 306). For example, when the designated target condition is the condition X, the CPU 11 rewrites the diagnosis software so that the condition X is disabled and the remaining conditions Y and Z are enabled. Then, the CPU 11 determines whether or not the diagnosis detections using the rewritten diagnosis software still keeps the frequency of the diagnosis detections in the decrease state (Step 307). When the CPU 11 determines that the frequency of the diagnosis detections increases, the CPU 11 terminates the program.

On the other hand, when the CPU 11 determines that the frequency of the diagnosis detections still keeps being in the decrease state or when the CPU 11 decides that the designated target condition is not the cause of the decrease in the frequency of the diagnosis detections, the CPU 11 changes the target condition from the condition X to the condition Y, and disables the condition X until cause investigation is completed. Then, the CPU 11 returns to Step 302, rewrites the diagnosis software for the sensor in question so that only the designated target condition is enabled, and performs the diagnosis detections for the sensor in question with the rewritten software.

When the designated target condition is the condition Y at Step 308, the CPU 11 changes the target condition from the condition Y to the condition Z, disables the conditions X and Y until the cause investigation is completed and performs similar procedure.

As described above, it is possible to automatically investigate the cause of decrease in the frequency of the diagnosis detections by designating one of the conjunctively connected diagnosis detection conditions as a target and repeating "enabling only the target condition" and "disabling only the target condition."

Embodiment 4

Alternatively, when frequency of diagnosis detections for a certain sensor decreases, a cause of the decrease in the frequency of the diagnosis detections for the creation sensor may be investigated based on a diagnosis detection condition, which is commonly used both (a) in the diagnosis detection for the certain sensor and (b) in a diagnosis detection for another sensor whose frequency of the diagnosis detections also decreases. This case will be described with reference to a flowchart shown in FIG. 5.

Since this case uses the same hardware configurations as that shown in FIG. 1, a detailed description of the hardware will be omitted.

Figure 5:
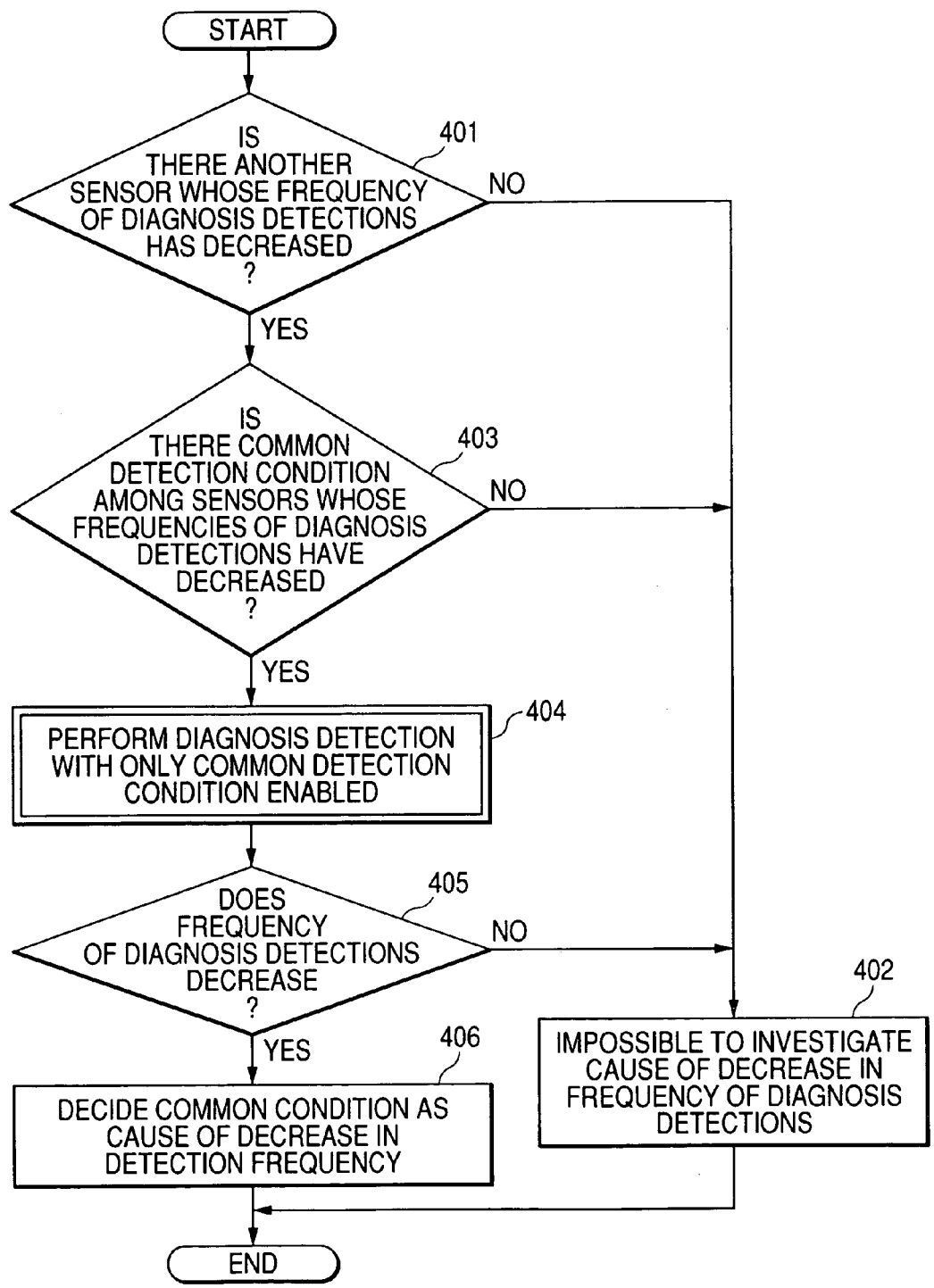
FIG. 5 is a flowchart showing procedures in a case where a cause is investigated based on a diagnosis detection condition, which is commonly used in a diagnosis detection for a sensor in question and another diagnosis detection for another sensor whose frequency of the diagnosis detections has decreased.

When investigating a cause of the decrease in the frequency of the diagnosis detections for a certain sensor is instructed, the CPU 11 of the diagnosis master ECU 1 performs a program, shown in the flowchart of FIG. 5, for investigating the cause of the decrease in the frequency of the diagnosis detections. At first, the CPU 11 determines whether or not there is another sensor whose frequency of diagnosis detections has decreased (Step 401). When the CPU 11 determines that there is no sensor whose frequency of diagnosis detections has decreased, the CPU 11 decides that it is impossible to investigate the cause of the decrease in the frequency of the diagnosis detections for the certain sensor (Step 402) and then terminates the program.

On the other hand, when the CPU 11 determines a Step 401 that there is another sensor whose frequency of diagnosis detections has decreased, the CPU 11 determines whether or not the diagnosis detection for the certain sensor and that for the other sensor include a common detection condition (Step 403). When the CPU 11 determines that the diagnosis detection for the certain sensor and that for the other sensor include no common detection condition, the CPU 11 decides that it is impossible to investigate the cause of the decrease in the frequency of the diagnosis detections for the certain sensor (Step 402) and then terminates the program.

When the CPU 11 determines at Step 403 that the diagnosis detection for the certain sensor and that for the other sensor include a common detection condition, the CPU 11 rewrites the diagnosis software for the certain sensor so that only the common detection condition is enabled, and performs the diagnosis detections for the certain sensor with the rewritten diagnosis software (Step 404).

Next, the CPU 11 determines whether or not the diagnosis detections for the certain sensor using the rewritten diagnosis software keep the frequency of the diagnosis detections being in the decrease state. When the CPU 11 determines that the frequency of the diagnosis detections for the certain sensor increases, the CPU 11 decides that it is impossible to investigate the cause of the decrease in the frequency of the diagnosis detections for the certain sensor (Step 402) and then terminates the program. On the other hand, when the CPU 11 determines that the frequency of the diagnosis detections for the certain sensor still is in the decrease state, the CPU 11 decides that the common detection condition is the cause of the decrease in the detection frequency (Step 406), and then terminates the program.

As described above, when frequency of diagnosis detections for a certain sensor decreases, a cause of the decrease in the frequency of the diagnosis detections for the creation sensor is investigated based on a diagnosis detection condition, which is commonly used both (a) in the diagnosis detection for the certain sensor and (b) in a diagnosis detection for another sensor whose frequency of the diagnosis detections also decreases. Thereby, the cause of the decrease in the frequency of the diagnosis detections can be investigated easily.

Embodiment 5

Further, in the case where the diagnosis detection condition including a plurality of hierarchic conditional statements shown in FIG. 6, when frequency of diagnosis detections for a sensor in question decreases, diagnosis software may be rewritten with processing of setting a monitor flag to ON incorporated into the conditional sentence of each hierarchy layer, to identify which hierarchy layer causes the decrease in the frequency of the diagnosis detections, and then any one of the method for investigating the cause of the decrease in the frequency of the diagnosis detections according to the first to fourth embodiments may be performed to investigate the cause of the decrease in the frequency of the diagnosis detections. This case will be described below with reference to a flowchart shown in FIG. 7.

Since this case uses the same hardware configuration as that shown in FIG. 1, a detailed description of the hardware will be omitted.

At first, the conditional statements of the diagnosis detection condition shown in FIG. 6 will be described. In order to determine as to whether or not the execution condition of the abnormality detection (i.e., the diagnosis detection condition) is satisfied, the program shown in FIG. 6 is executed. When the program starts, the CPU 11 of the diagnosis master ECU 1 determines whether or not the condition statements in the hierarchy layer 1 are satisfied, that is, whether or not both conditions A and B are satisfied. When the CPU 11 determines that both the conditions A and B are satisfied, the program proceeds to the hierarchy layer 2. Then, the CPU 11 determines whether or not the condition statements in the hierarchy layer 2 are satisfied, that is, whether or not both conditions C and D are satisfied. When the CPU 11 determines that both the conditions C and D are satisfied, the program proceeds to the hierarchy layer 3. Similarly, the CPU 11 determines whether or not the condition statements in the hierarchy layer 3 are satisfied, that is, whether or not both conditions E and F are satisfied. When the CPU 11 determines that both the conditions E and F are satisfied, the CPU 11 executes the abnormality detection (not detailed in FIG. 6). If the CPU 11 determines in execution of the program shown in FIG. 6 that any of the conditional sentences 1 to 3 is not satisfied, the CPU 11 skips the remaining program (the remaining hierarchic layers) and the abnormal detection processing, and then proceeds to another processing.

The conditions A to F may relate to temperatures of the engine cooling water, vehicle speed, engine revolutions, status of each sensor mounted on the vehicle (e.g., ON/OFF state of a sensor) or the like. Several examples will be described later with reference to FIGS. 10 to 12.

Figure 7:
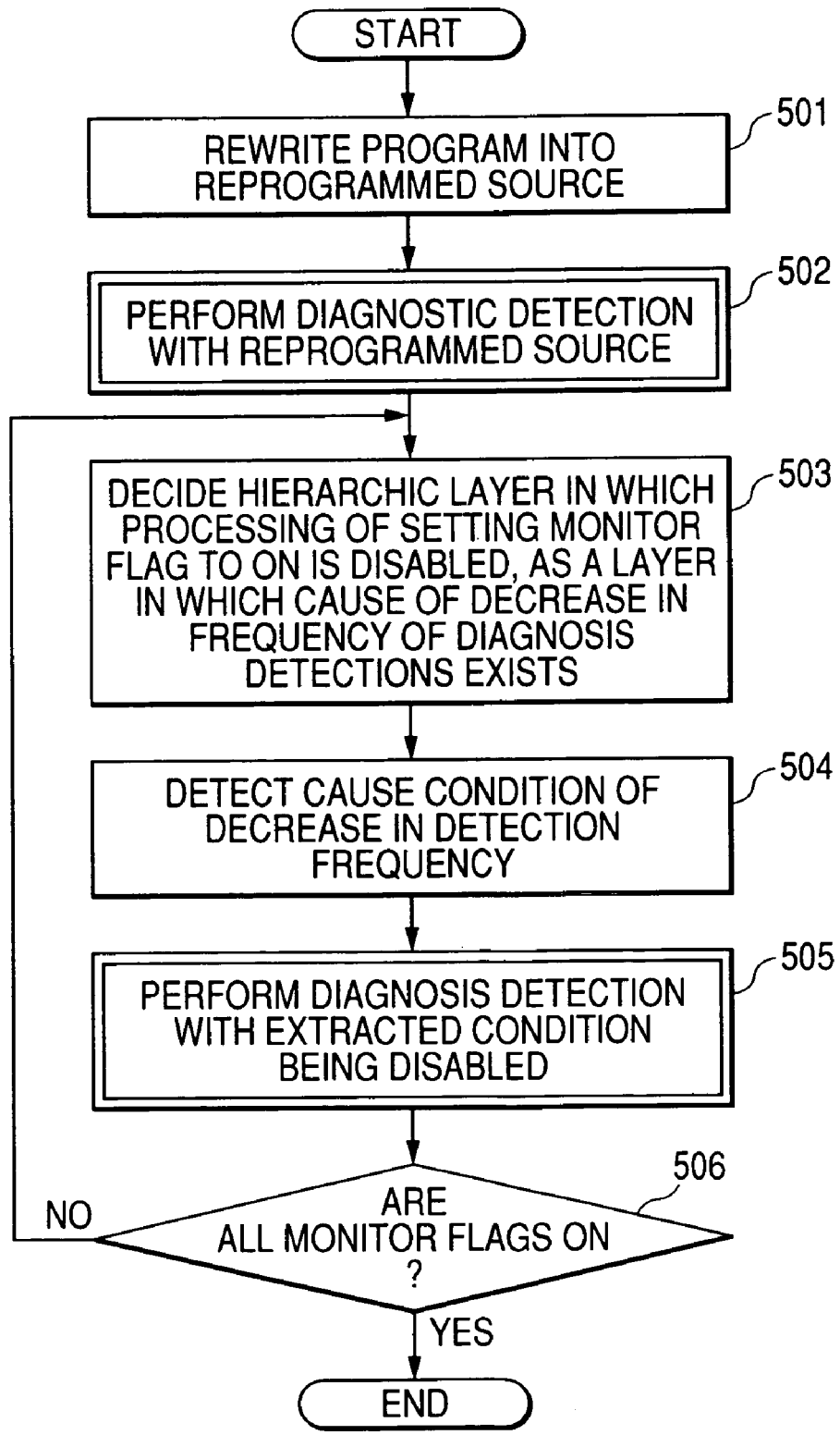
FIG. 7 is a flowchart showing procedures in a case where software is rewritten with processing of setting a monitor flag to ON incorporated into the hierarchical conditional statements.

When investigating a cause of the decrease in the frequency of the diagnosis detections for a sensor in question is instructed, the CPU 11 of the diagnosis master ECU 1 performs a program, shown in the flowchart of FIG. 7, for investigating the cause of the decrease in the frequency of the diagnosis detections. At first, the CPU 11 rewrites a diagnosis program for a sensor in question including the plurality of hierarchic conditional statements (for example, the program shown in FIG. 6) into a reprogrammed source program shown in FIG. 8. Specifically, the CPU 11 adds statements 801 to 803 to the respective hierarchic layers 1 to 3. The statements 801 to 803 set monitor flags 1 to 3 to ON, respectively. If the CPU 11 determines in execution of the resultant program shown in FIG. 8 that any of the hierarchic layers 1 to 3 is satisfied, the CPU 11 sets a corresponding monitor flag to ON. Then, the CPU 11 stores the generated reprogrammed source in the RAM 13 (Step 501).

Next, the CPU 11 performs a diagnosis detection for the sensor in question with the reprogrammed source stored in the RAM 13 (Step 502). Then, the CPU 11 identifies a hierarchic layer—in which the processing of setting the monitor flag to ON has not been executed—as a layer in which the cause of decrease in the frequency of the diagnosis detections exists (Step 503). For example, it is assumed that the conditions A to D are satisfied but one of the conditions of E and F is not satisfied in execution of the reprogrammed source program at step 502. In this case, the CPU 11 determines that the conditional statements in the hierarchic layers 1 and 2 are true and executes the statements 801 and 802, that is, sets the monitor flags 1 and 2 to ON. However, the CPU 11 determines that the condition statement in the hierarchic layer 3 is false and does not execute the statement 803. Therefore, after the reprogrammed source program is executed, the monitor flag 3 is still OFF. From this, the CPU 11 identifies the hierarchic layer 3 as a layer in which the cause of decrease in the frequency of the diagnosis detections exists.

Thereafter, the CPU 11 detects which condition included in the hierarchic layer—in which the cause of decrease in the frequency of the diagnosis detections exists—is the cause condition (Step 504). In the above specific example, the CPU 11 determines which of the condition E or F is the cause condition.

In this case, with regard to investigating the cause condition of the decrease in the detection frequency, any one of the cause condition detections shown in FIGS. 2 to 5 may be performed to investigate the cause condition.

After the CPU 11 performs the cause condition detection at Step 504, the CPU 11 disables the detected condition and then performs the diagnosis detection for the sensor in question with the reprogrammed source again (Step 505). Thereafter, the CPU 11 determines whether or not all of the monitor flags are set to ON (Step 506). When there is a monitor flag, which is not set to ON, the operation returns to Step 503 and the CPU 11 identifies the hierarchic layer—in which the processing of setting the monitor flag to ON is disabled—as a hierarchic layer—in which the cause of decrease in the frequency of the diagnosis detections exists. Then, the CPU 11 detects the cause condition of the decrease in the detection frequency.

As described above, when frequency of diagnosis detections for a sensor in question decreases, diagnosis software is rewritten with processing of setting a monitor flag to ON incorporated into the conditional sentence of each hierarchy layer, to identify which hierarchy layer causes the decrease in the frequency of the diagnosis detections, and then the cause of the decrease in the frequency of the diagnosis detections is investigated. Thereby, the cause of the decrease in the frequency of the diagnosis detections can be investigated automatically.

Embodiment 6

When frequency of diagnosis detections decreases, the diagnosis detection condition may be changed to a condition, which is easily satisfied, to investigate a cause of the decrease in the frequency of the diagnosis detections.

That is, in the case where the diagnosis detection condition includes, for example, "AD value>threshold value,"

when the frequency of the diagnosis detections for a sensor in question decreases, the CPU 11 rewrites a diagnosis software so as to change the threshold value to a value closer to a normal value, performs a diagnosis detection for the sensor in question with the rewritten diagnostic software and determines whether or not the frequency of the diagnosis detection still is in the decrease state. When the frequency of the diagnosis detection increases, the CPU 11 can decide that "settings of the threshold value is inappropriate," and identify this fact as a cause of the decrease in the frequency of the diagnosis detections.

When the diagnostic condition includes, for example, "time duration in which a specific state occurs" and/or "number of times a specific state occurs", the time duration and the number of times may be changed to values closer to normal values similarly, and it may be determined whether or not such conditions are a cause of the decrease in the frequency of the diagnosis detections.

Further, when a case condition of the decrease in the frequency of the diagnosis detections is identified by performing any one of the cause condition detections shown in the flowcharts of FIGS. 2 to 5 and 7 and the identified condition includes one whose easiness of condition establishment us adjustable such as "threshold value", "duration time" and "number of times", such a condition may be changed to be another condition, which is satisfied more easily than the previous condition. Thereby, the case can be investigated in more detail.

Embodiment 7

In the above-described embodiments, examples in which a user brings a vehicle to a repair shop such as a dealer and runs the vehicle on a chassis to investigate a cause of decrease in frequency of diagnosis detections for each sensor are described. However, a cause of decrease in frequency of diagnosis detections may be investigated while the vehicle is running. The case where a cause of decrease in frequency of diagnosis detections is investigated while the vehicle is running will be described.

Since this case uses the same hardware configuration as that shown in FIG. 1, a detailed description of the hardware will be omitted.

The CPU 11 of the diagnosis master ECU 1 performs a program for alternately executing the diagnosis detection shown in the flowchart shown in FIG. 9 and the cause investigation every constant time. When this program starts, at first the CPU 11 determines whether or not the program for investigating a case was performed at previous time (Step 601). When the CPU 11 determines that the program for investigating a case was performed, the CPU 11 performs a usual diagnosis detection program (Step 602).

On the other hand, when the CPU 11 determines that the program for investigating a cause was not performed, the CPU 11 determines whether or not a denominator value of the rate counter, that is, number of times the ignition switch is turned on/off is equal to or larger than a predetermined value (Step 603). When the denominator value of the rate counter is less than the predetermined value, the CPU 11 terminates the program.

On the other hand, when the CPU 11 determines at Step 603 that the denominator value of the rate counter is equal to or larger than the predetermined value, the CPU 11 determines whether or not a value (%) of the rate counter is equal to or less than a predetermined value (Step 604). When the value (%) of the rate counter is equal to or larger than the predetermined value, the CPU 11 determines that the frequency of the diagnosis detections does not decrease and terminates the program.

On the other hand, when the CPU 11 determines at Step 604 that the value (%) of the rate counter is less than the predetermined value, the CPU 11 determines that the frequency of the diagnosis detections decreases and performs the program for investigating the cause (Step 605).

As the above program for investigating the cause, any one of the programs for detecting a cause condition according to the first to sixth embodiments can be employed. For example, it is assumed that a diagnosis detection condition includes three conjunctively connected conditions, that is, a condition that water temperature is higher than 80° C., a condition that vehicle speed is lower than 30 km/h and a condition that sensor A is ON, as shown in FIG. 10. In this case, the diagnosis detection is performed with the normal condition as shown in FIG. 11A. When investigating the cause, rewriting 80° C. to the minimum value MIN, which the water temperature can have; rewriting 30 km/h to the maximum speed MAX, which the speed can have; and rewriting to a condition, which is satisfied whenever a sensor A of the third condition is either on or off as shown in FIGS. 11B, 11C and 11D are performed in order. Since the rewritten condition is satisfied at any time, the cause of the decrease in the frequency of the diagnosis detections can be investigated.

Also, an OR condition, which is not satisfied normally, may be set to the diagnosis detection condition so that the diagnosis detection condition is always satisfied during investigating a cause. For example, rewriting is performed as follows. As shown in FIG. 12, a OR condition for FLAG 1 is added to each condition of the diagnosis detection condition, and a value of FLAG 1 is set to OFF in advance. During the diagnosis detection, FLAG 1=ON is set as an OR condition as shown in FIG. 12A. During the cause investigation, FLAG 1=OFF is set as an OR condition as shown in FIGS. 12B and 12C. Since the condition is always satisfied, the cause of the decrease in the frequency of the diagnosis detections can be investigated.

Figure 13:
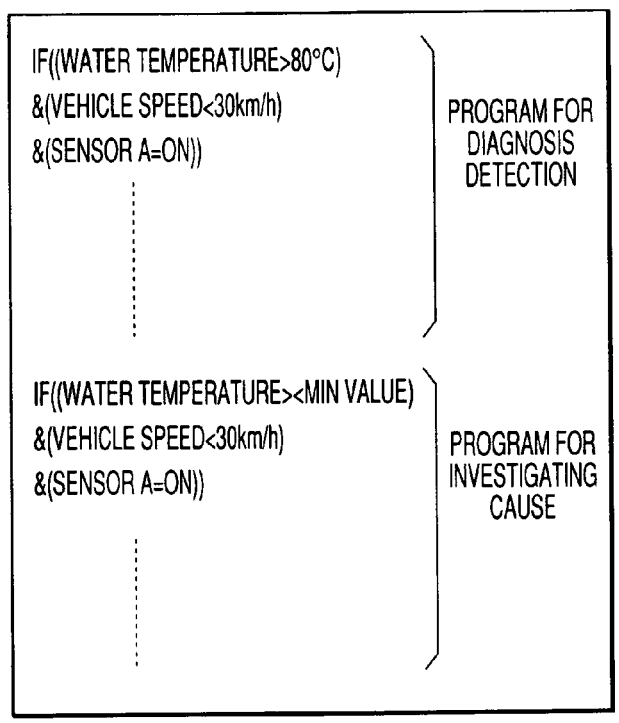
FIG. 13 shows an example of a program, which is a combination of a diagnosis detection program and a program for investigating a cause of the decrease in the frequency of the diagnosis detections.
Figure 14:
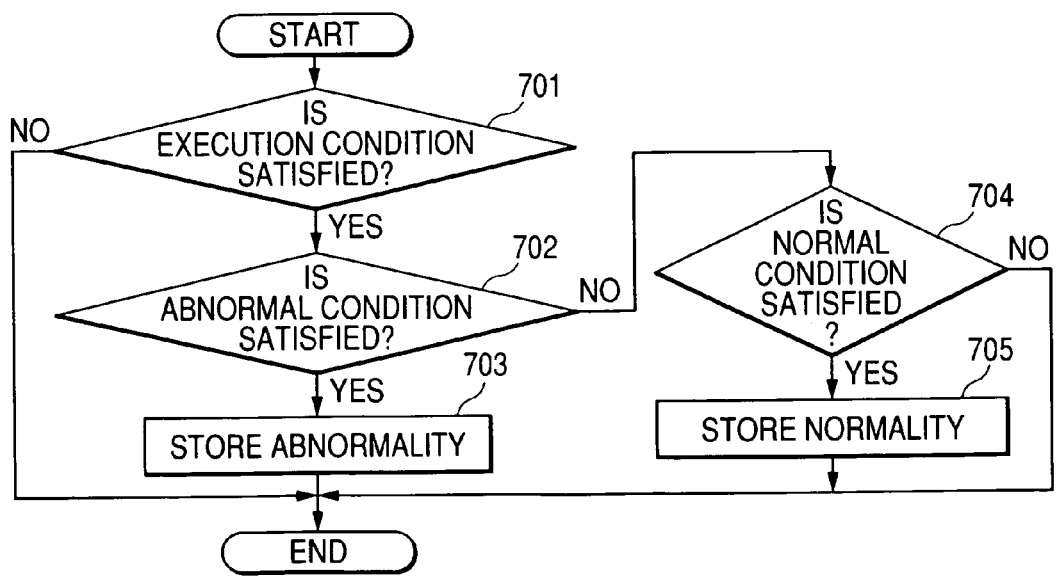
FIG. 14 is a flowchart showing procedures of an abnormal diagnosis program for each sensor, which is performed by ECU.

Further, in the above embodiment, the diagnosis detection period is set to ½ of the usual diagnosis detection period and the diagnosis detection and the cause investigation are alternately performed. In this case, the detection period is short and thus, the processing load of the CPU becomes increased. Therefore, a program in which a program for the diagnosis detection and the program for the cause investigation are combined may be used as a diagnosis detection program as shown in FIG. 13. The diagnosis detection and the cause investigation are performed simultaneously with the usual period. Thereby, the processing load of the CPU can be decreased.

Embodiment 8

Next, a method for improving the frequency of the diagnosis detections after the condition, which is the cause of the decrease in the frequency of the diagnosis detections, is detected will be described.

Assuming that when the frequency of the diagnosis detections decreased, any of the cause condition detections according to FIGS. 2 to 5 and 7 was performed and the cause of the decrease in the frequency of the diagnosis detections has been identified. In this case, the CPU 11 of the diagnosis master ECU 1 may rewrite the diagnosis software for a sensor in question read from the ROM 12 so that the identified condition is disabled, and replace the original diagnosis software for the sensor in question with the rewritten diagnosis software. Thereby, the frequency of the diagnosis detections can be increased.

Also, assuming that when the frequency of the diagnosis detections decreased, any of the cause condition detections according to FIGS. 2 to 5 and 7 was performed and the cause of the decrease in the frequency of the diagnosis detections and a cause portion have been identified. If the identified condition includes one whose easiness of condition establishment us adjustable such as "threshold value", "duration time" and "number of times", the CPU 11 may rewrite the diagnosis software for a sensor in question read from the ROM 12 so that the cause portion (e.g., threshold value, duration time and number of times) in the cause condition is changed so as to be satisfied more easily, and replace the original diagnosis software for the sensor in question with the rewritten diagnosis software. Thereby, the frequency of the diagnosis detections can be increased.

Embodiment 9

Further, the cause condition of the decrease in the detection frequency, the cause portion and vehicle information may be transmitted to a center, and the center may use such transmitted data.

That is, when any of methods for detecting cause condition of the decrease in the frequency of the diagnosis detections according to the above embodiments is performed and a cause condition of the decrease in the detection frequency and a case portion are detected, the CPU 11 of the diagnosis master ECU 1 may transmit such information, vehicle information before the cause investigation and vehicle information at the time when the detection frequency changes during the cause investigation, through the remote server 15 to the center 7. Thereby, the center 7 can further investigate detailed cause of the decrease in the detection frequency and study countermeasure based on the transmitted data.

Also, when frequency of diagnosis detections decreases, the CPU 11 may transmit a cause condition of the decrease in the detection frequency, a cause portion, vehicle information before the cause investigation and vehicle information at the time when the detection frequency changes during the cause investigation, through the remote server 15 to the center 7. Then, the center 7 may rewrite a diagnosis software for a sensor in question so that the identified condition is not applied to the diagnosis detection condition, and transmit the rewritten diagnosis software to the remote server 15 of the diagnosis master ECU 1. The CPU 11 replaces the diagnosis software for the sensor in question, to thereby increase the frequency of the diagnosis detections.

Also, when frequency of diagnosis detections decreases, the CPU 11 may transmit a cause condition of the decrease in the detection frequency, a cause portion, vehicle information before the cause investigation and vehicle information at the time when the detection frequency changes during the cause investigation, through the remote server 15 to the center 7. If the cause condition of the decrease in the frequency of the diagnosis detections includes one whose easiness of condition establishment us adjustable such as "threshold value", "duration time" and "number of times", the center 7 may rewrite the diagnosis software for a sensor in question so that the cause portion (e.g., threshold value, duration time and number of times) in the cause condition is changed so as to be satisfied more easily, and transmit the rewritten the rewritten diagnosis software to the remote server 15 of the diagnosis master ECU 1. The CPU 11 replaces the diagnosis software for the sensor in question, to thereby increase the frequency of the diagnosis detections.

In the above-described embodiments, when the frequency of the diagnosis detections decreases, the diagnosis master ECU 1 or the center 7 investigate cause thereof and rewrite the diagnosis software for a sensor in question. Alternatively, when the frequency of the diagnosis detections decreases, the diagnosis master ECU 1 may cause each ECU to investigate the cause and rewrite the diagnosis software for the sensor in question. Also, each ECU may detect whether or not the frequency of the diagnosis detection decreases. In this case, when detecting tat the frequency of the diagnosis detection decreases, each ECU investigates cause thereof and rewrite a diagnosis software for a sensor in question.

What is claimed is:

1. A method for investigating a cause of decrease in frequency of abnormality detections for a certain device mounted on a vehicle, wherein when a plurality of abnormality detection conditions are satisfied, an abnormality detection for the certain device is performed to determine if the certain device is in failure, the method comprising:
  (i) when the frequency of the abnormality detections is below a predetermined value, disabling one of the abnormality detection conditions;
  (ii) when the abnormality detection conditions except the disabled abnormality detection condition are satisfied, performing an abnormality detection for the certain device;
  (iii) repeating the step (ii) a plurality of times; and
  (iv) determining if the disabled abnormality detection condition at that time is the cause of the decrease in the frequency of the abnormality detections, based on frequency of the abnormality detections in the step (iii).

2. The method according to claim 1, further comprising:
  (v) if the determining in the step (iv) is negative, enabling the disabled one of the abnormality detection conditions and disabling another one of the abnormality detection conditions; and
  (vi) repeating the steps (ii) to (v).

3. The method according to claim 2, wherein the step (vi) is performed until the cause of the decrease in the frequency of the abnormality detections is found.

4. The method according to claim 2, wherein:
  the disabling of the step (i) comprises rewriting the one of the abnormality detection conditions so as to be always satisfied; and
  the disabling of the step (v) comprises rewriting the another abnormality detection condition so as to be always satisfied.

5. The method according to claim 2, wherein:
  the disabling of the step (i) comprises rewriting the one of the abnormality detection conditions so as to be satisfied more easily than that before the rewriting of the step (i); and
  the disabling of the step (v) comprises rewriting the another abnormality detection condition so as to be satisfied more easily than that before the rewriting of the step (v).

6. The method according to claim 2, wherein in the step (v), the one of the abnormality detection conditions is higher in possibility of the cause of the decrease in the frequency of the abnormality detection than the another one of the abnormality detection conditions.

7. The method according to claim 1, wherein the step (iv) comprises:
   comparing the frequency of the abnormality detections in the step (iii) with the frequency of the abnormality detections before the method is performed; and
   determining if the disabled abnormality detection condition at that time is the cause of the decrease in the frequency of the abnormality detections based on a comparing result.

8. The method according to claim 1, wherein the disabling of the step (i) comprises rewriting the one of the abnormality detection conditions so as to be always satisfied.

9. The method according to claim 1, wherein the abnormality detection conditions form a plurality of hierarchic layers each comprising a plurality of conditional statements, the method further comprising:
   rewriting a program for determining whether or not the abnormality detection conditions are satisfied so as to add to a conditional statement of each hierarchic layer a statement, which sets a monitor flag to ON or OFF; and
   identifying which hierarchic layer comprises the cause of the decrease in the frequency of the abnormality detections, wherein:
   the rewriting and the identifying are performed before the step (i).

10. The method according to claim 1, wherein the disabling of the step (i) comprises rewriting the one of the abnormality detection conditions so as to be satisfied more easily than that before the rewriting.

11. The method according to claim 1, wherein the step (iii) comprises turning on and off an ignition switch of vehicle the plurality of time.

12. The method according to claim 11, wherein the frequency of the abnormality detections for the certain device is defined as a value obtained by dividing an actual frequency of the abnormality detections for the certain device within a predetermined time period by number of times the ignition switch of the vehicle is turned on within the predetermined time period.

13. A method for improving frequency of abnormality detections comprising:
   after the method according to claim 1 is performed, rewriting an abnormality detection condition, which has been determined as the cause of the decrease in the frequency of the abnormality detections for the certain device, so as to be satisfied more easily than that before the rewriting.

14. A method for improving frequency of abnormality detections comprising:
   after the method according to claim 1 is performed, disabling an abnormality detection condition, which has been determined as the cause of the decrease in the frequency of the abnormality detections for the certain device.

15. The method according to claim 1, further comprising:
   when the cause of the decrease in the frequency of the abnormality detections for the certain device is found, transmitting the cause to a center.

16. A method for improving frequency of abnormality detections comprising:
   after the method according to claim 1 is performed, transmitting to a center an abnormality detection condition, which has been determined as the cause of the decrease in the frequency of the abnormality detections for the certain device; and
   disabling the transmitted abnormality detection condition by the center, to temporarily increase the frequency of the diagnosis detections.

17. A method for improving frequency of abnormality detections comprising:
   after the method according to claim 1 is performed, transmitting to a center an abnormality detection condition, which has been determined as the cause of the decrease in the frequency of the abnormality detections for the certain device; and
   rewriting the transmitted abnormality detection condition by the center so that the rewritten abnormal detection condition is satisfied more easily than that before the rewriting, to thereby temporarily increase the frequency of the diagnosis detections.

18. The method according to claim 1, wherein an abnormality detection master ECU that monitors ECUs for controlling the vehicle performs the method.

19. The method according to claim 1, wherein:
   in the step (i), when the frequency of the abnormality detections is below the predetermined value, an abnormality detection master ECU instructs another ECU whose frequency of the abnormality detections is determined to be decreased to investigate the cause of the decrease in the frequency of the abnormality detections; and
   the another ECU performs the remaining steps.

20. The method according to claim 1, wherein respective ECUs perform the method.

21. A method for diagnosing a vehicle, the method comprising:
   (a) while the vehicle is running, performing the method of claim 1; and
   (b) while the vehicle is running, detecting an abnormality of the certain device.

22. The method according to claim 21, wherein the steps (a) and (b) are performed alternatively.

23. The method according to claim 21, wherein the steps (a) and (b) are performed simultaneously.

24. An electronic control apparatus for a vehicle, the apparatus comprising:
   an abnormal detecting unit that performs an abnormality detection based on a plurality of abnormality detection conditions, to determine if a certain device mounted on the vehicle is in failure; and
   an abnormality cause investigating unit that investigates a cause of decrease in frequency of the abnormality detections for the certain device, wherein:
   when the frequency of the abnormality detections is below a predetermined value, the abnormality cause investigating unit disables one of the abnormality detection conditions,
   when the abnormality detection conditions except the disabled abnormality detection condition are satisfied, the abnormal detecting unit performs an abnormality detection for the certain device; and
   the abnormality cause investigating unit determines if the disabled abnormality detection condition at that time is the cause of the decrease in the frequency of the abnormality detections, based on the frequency of the abnormality detections performed by the abnormal detecting unit.

25. A method for investigating a cause of decrease in frequency of abnormality detections for a certain device mounted on a vehicle, wherein when a plurality of abnormality detection conditions are satisfied, an abnormality detection for the certain device is performed to determine if the certain device is in failure, the method comprising:

(i) when the frequency of the abnormality detections is below a predetermined value, disabling the abnormality detection conditions except one of the abnormality detection conditions;

(ii) when the one of the abnormality detection conditions is satisfied, performing an abnormality detection for the certain device;

(iii) repeating the step (ii) a plurality of times;

(iv) determining if the one of the abnormality detection conditions at that time is the cause of the decrease in the frequency of the abnormality detections, based on frequency of the abnormality detections in the step (iii);

(v) enabling the abnormality detection conditions other than the one of the abnormality detection conditions while disabling the one of the abnormality detection conditions; and (vi) when the others of the abnormality detection conditions except the disabled one of the abnormality detection conditions are satisfied, performing an abnormality detection for the certain device;

(vii) repeating the step (vi) a plurality of times; and (viii) determining if the disabled one of the abnormality detection conditions at that time is the cause of the decrease in the frequency of the abnormality detections, based on frequency of the abnormality detections in the step (vi).

26. A method for investigating a cause of decrease in frequency of abnormality detections for a certain device mounted on a vehicle, wherein when a plurality of abnormality detection conditions are satisfied, an abnormality detection for the certain device is performed to determine if the certain device is in failure, the method comprising:

(i) when the frequency of the abnormality detections for the certain device is below a first predetermined value, disabling the abnormality detection conditions except one of the abnormality detection conditions, wherein abnormality detection conditions for another device whose frequency of abnormality detections is below a second predetermined value contains the one of the abnormality detection conditions;

(ii) when the one of the abnormality detection conditions except the disabled abnormality detection conditions is satisfied, performing an abnormality detection for the certain device;

(iii) repeating the step (ii) a plurality of times; and (iv) determining if the one of the abnormality detection conditions at that time is the cause of the decrease in the frequency of the abnormality detections, based on frequency of the abnormality detections for the certain device in the step (iii).

* * * * *